US008204260B2

(12) United States Patent
Suzuki

(10) Patent No.: US 8,204,260 B2
(45) Date of Patent: Jun. 19, 2012

(54) SPEAKER APPARATUS, SPEAKER DRIVING APPARATUS AND CONTROL METHOD THEREOF

(75) Inventor: Noriaki Suzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1093 days.

(21) Appl. No.: 12/014,981

(22) Filed: Jan. 16, 2008

(65) Prior Publication Data

US 2008/0199020 A1 Aug. 21, 2008

(30) Foreign Application Priority Data

Feb. 16, 2007 (JP) ................................ 2007-036604

(51) Int. Cl.
*H04R 3/12* (2006.01)
*H04R 5/02* (2006.01)
*H04R 3/00* (2006.01)
*H03G 11/00* (2006.01)

(52) U.S. Cl. ............ 381/300; 381/303; 381/55; 381/59; 381/116; 381/120; 381/123

(58) Field of Classification Search .................. 381/300, 381/303, 94.9, 94.1, 94.8, 77, 55, 58, 59, 381/96, 111, 116, 120, 123
See application file for complete search history.

(56) References Cited

U.S. PATENT DOCUMENTS

| | | | | |
|---|---|---|---|---|
| 4,583,245 | A * | 4/1986 | Gelow et al. | 381/59 |
| 4,887,298 | A * | 12/1989 | Haigler | 381/55 |
| 5,815,584 | A * | 9/1998 | Whitecar et al. | 381/86 |
| 7,050,594 | B2 * | 5/2006 | Nakada et al. | 381/96 |
| 7,521,936 | B2 * | 4/2009 | Stanley | 324/522 |
| 2003/0118193 | A1 * | 6/2003 | Leske et al. | 381/59 |
| 2003/0194097 | A1 * | 10/2003 | Ding | 381/96 |

FOREIGN PATENT DOCUMENTS

| | | | |
|---|---|---|---|
| JP | 63-171091 | A | 11/1988 |
| JP | 3-203498 | A | 9/1991 |
| JP | 06-350544 | A | 12/1994 |
| JP | 07-095699 | A | 4/1995 |
| JP | 8-172693 | A | 7/1996 |
| JP | 63-171091 | | 11/1998 |
| JP | 2006-140824 | A | 6/2006 |
| JP | 2006-191250 | A | 7/2006 |

* cited by examiner

*Primary Examiner* — Edgardo San Martin
(74) *Attorney, Agent, or Firm* — Canon U.S.A., Inc., IP Division

(57) ABSTRACT

The present invention provides a sound producing apparatus which suppresses an increase in electric power consumption and cost, and an increase in a number of wiring when a plurality of speaker apparatuses is configured. A speaker driving apparatus supplies electric power to a speaker apparatus, acquires information about an electroacoustic characteristic and maximum input electric power of each speaker apparatus from the speaker apparatus, and executes characteristic correction and output electric power restriction according to the information.

16 Claims, 12 Drawing Sheets

FIG. 10
SIGNAL SOURCE
(CD PLAYER ETC.)
AMPLIFIER
(SPEAKER DRIVING
APPARATUS)
SPEAKER
APPARATUS
SPEAKER

SPEAKER APPARATUS, SPEAKER DRIVING APPARATUS AND CONTROL METHOD THEREOF

BACKGROUND OF THE INVENTION

1. Field of the Invention

The present invention relates to a sound player including a speaker apparatus and a speaker driving apparatus, and its control method. Particularly, the present invention relates to the sound player in which the speaker apparatus and the speaker driving apparatus mutually transmits and receives a speaker characteristic and electric power to control an audio signal, and its control method.

2. Description of the Related Art

Conventionally, a Motional Feedback (MFB) has been known as a technique to correct an electroacoustic characteristic of a speaker apparatus. The MFB technique feeds back a detection signal of a vibration speed in the speaker apparatus and corrects the electroacoustic characteristic based on the detection signal.

A speaker driving apparatus using the MFB easily causes oscillation due to a phase rotation of a detection signal which becomes a feedback signal. Japanese Patent Application Laid-Open No. 3-203498 discusses a speaker system that internally includes a Digital Signal Processor (DSP) which executes correction computing and a digital interface. The speaker system adds the data that correct an electroacoustic characteristic of a speaker apparatus to an input signal in advance, thereby resolving the oscillation problem of the MFB technique.

Further, conventionally, a speaker protection circuit has been known. The speaker protection circuit regulates an output electric current of an amplifier circuit to be equal or less than an allowable limit. The speaker protection circuit prevents an accident such as disconnection of wire due to heating of a voice coil when a speaker apparatus is driven in a large sound volume.

In a conventional speaker protection circuit, there is a problem of a power loss since the speaker protection circuit detects an electric current applied to a speaker by a dropped voltage of a resistor. Further, together with decrease in power efficiency of the speaker protection circuit, distortion may be caused.

Japanese Patent Application Laid-Open No. 8-172693 discusses a speaker driving circuit that detects a signal current which flows through an output resistance of the output stage of an audio amplifier circuit, and controls the sound volume of a sound volume control circuit by the detected signal electric current to regulate the amount of output electric current.

However, according to the speaker apparatus discussed in Japanese Patent Application Laid-Open No. 3-203498, power needs to be supplied to each speaker apparatus. Therefore, electric power consumption and a cost of the speaker apparatus are increased when a plurality of speaker apparatuses is arranged, for example, in a home theater system that has a 5.1 channel configuration.

Further, unlike a general sound player illustrated in FIG. 10, as illustrated in FIG. 11, according to the above conventional sound player, an output signal of a signal source needs to be input to an amplifier through a speaker apparatus, which increases a number of wirings. Furthermore, according to the conventional sound player, power has to be supplied to a correction unit, and an input and output unit inside the speaker apparatus, which increases a number of wirings of a power supply and complicates the wiring.

Still furthermore, the speaker protection circuit discussed in Japanese Patent Application Laid-Open No. 8-172693 may supply electric power exceeding maximum input electric power to the speaker apparatus when an arbitrary speaker apparatus is connected to an output of the speaker apparatus. This is because the speaker protection circuit discussed in Japanese Patent Application Laid-Open No. 8-172693 does not include a unit configured to identify maximum input electric power and a unit configured to adjust a limit of an output electric current, in the connected speaker driving circuit.

SUMMARY OF THE INVENTION

The present invention is directed to a sound player including a speaker apparatus and a speaker driving apparatus, and its control method.

According to a first aspect of the present invention, a speaker driving apparatus adapted to be connected to a speaker apparatus, the speaker driving apparatus includes an amplification unit for amplifying an input audio signal to generate an output audio signal for driving the speaker apparatus, a power signal generation unit operable to generate a power signal for transmission to the speaker apparatus, a transmission unit operable to transmit the output audio signal and the power signal to the speaker apparatus, a reception unit for receiving, from the speaker apparatus, a data signal representing data relating to one or more characteristics of the speaker apparatus, and a signal modification unit operable to modify at least one audio signal in dependence upon the received data signal.

According to a second aspect of the present invention, a speaker apparatus, adapted to be connected to a speaker driving apparatus, the speaker apparatus includes a power signal receiving unit for receiving a power signal from the speaker driving apparatus, a power conversion unit for converting the received power signal into DC power, and a data signal transmission unit operable to transmit to the speaker driving apparatus data relating to one or more characteristics of the speaker apparatus using the DC power from the power conversion unit as a power supply.

An embodiment of the present invention can provide sound player capable of suppressing not only an increase in electric power consumption and cost, but also an increase in a number of wirings.

Another embodiment of the present invention can provide a sound player capable of faithful reproduction that executes a suitable characteristic correction corresponding to an electroacoustic characteristic of the speaker apparatus, and capable of safe reproduction that restricts output so that the output does not exceed maximum input electric power.

The above effects are significant in embodiments of the invention in which a plurality of speaker apparatuses is provided and the speaker apparatus is changed to a different one.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

First Exemplary Embodiment

Figure 1:
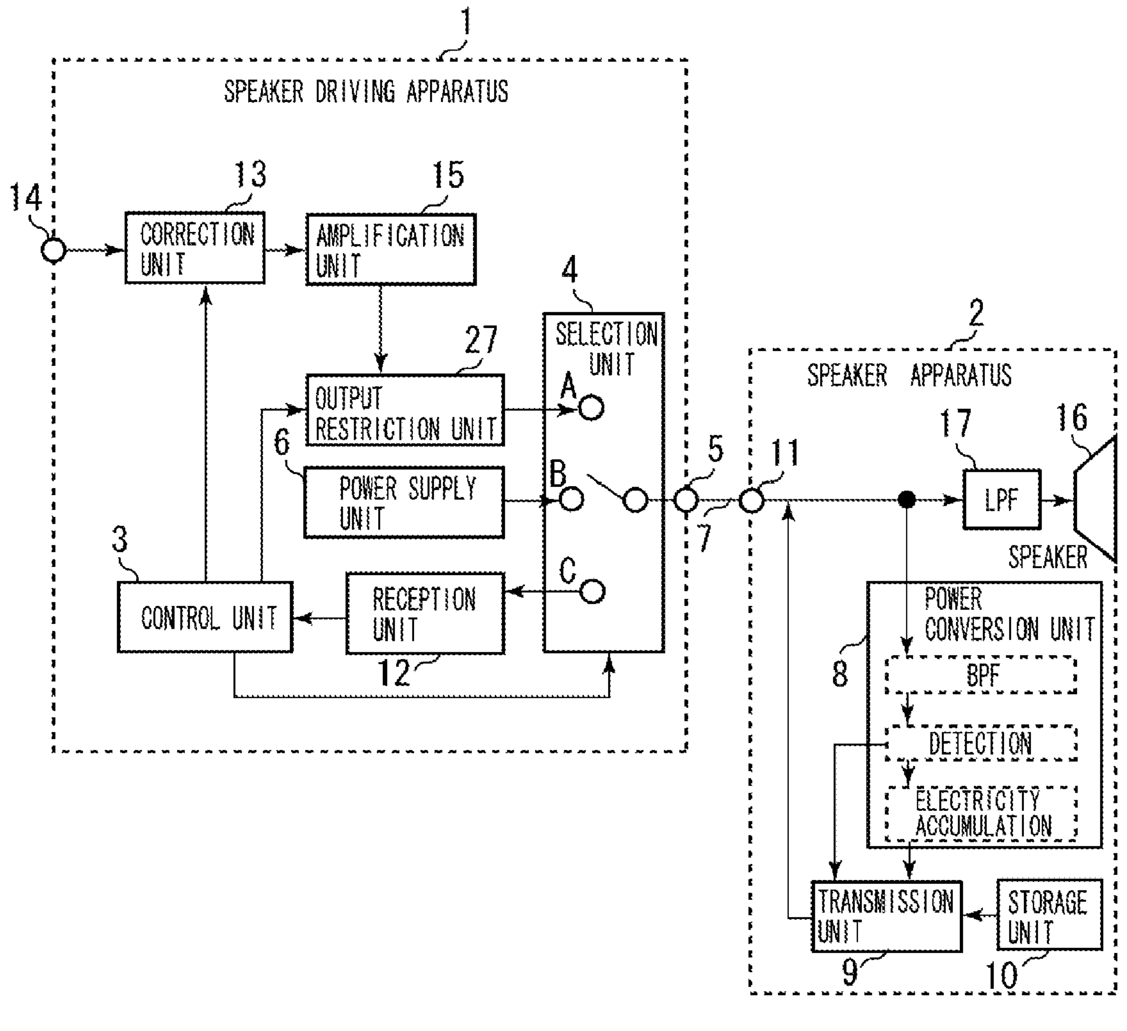
FIG. 1 is a block diagram illustrating a sound player according to a first exemplary embodiment of the present invention.

FIG. 1 is a block diagram illustrating a sound player according to a first exemplary embodiment of the present invention.

The sound player connects a speaker driving apparatus 1 and a speaker apparatus 2 through a cable 7. The speaker apparatus 1 includes the following configuration. The speaker driving apparatus 1 inputs an audio signal from a signal source to an audio input unit 14. The speaker driving apparatus 1 executes predetermined correction processing of the input audio signal in a correction unit 13. An amplification unit 15 amplifies an output of the correction unit 13 to a level at which a speaker unit 16 of the speaker apparatus 2 can be driven. An output restriction unit 27 limits the amount of output electric power in the amplification unit 15 to be less or equal to a predetermined restriction value. A power supply unit 6 outputs a high-frequency power signal that is beyond the range of human hearing. A reception unit 12 receives a data signal transmitted by a transmission unit 9 in the speaker apparatus 2. The speaker driving apparatus 1 also includes a selection unit 4 connected to a connection terminal 5 (input and output unit). The selection unit 4 selectively connects the output restriction unit 27, the power supply unit 6, and the reception unit 12 with the output terminal 5. A control unit 3 not only controls the selection unit 4, but also sets a correction characteristic in the correction unit 13 and a restriction value in the output restriction unit 27.

The speaker apparatus 2 includes the following configuration. The speaker unit 16 converts an audio signal input from an input terminal 11 into an audible sound. An electroacoustic characteristic storage unit 10 stores data of electroacoustic characteristic and maximum input electric power about the speaker apparatus 2. The speaker apparatus 2 converts at least one of the electroacoustic characteristic data and the maximum input electric power data stored in the storage unit 10 into a data signal including a high-frequency component beyond the range of human hearing and transmits the data signal from the transmission unit 9 to the speaker driving apparatus 1. That is, the data signal is a signal corresponding to the data of the electroacoustic characteristic and/or the maximum input electric power. A power conversion unit 8 converts a power signal output from the power supply unit 6 of the speaker driving apparatus 1 into a power to be supplied to the transmission unit 9. The power conversion unit 8 includes a Band Pass Filter (BPF), a detection unit, and an electricity accumulation unit. The speaker apparatus 2 converts the power signal whose frequency band is restricted through the BPF, into a direct current signal in the detection unit. The speaker apparatus 2 accumulates the power signal in the electricity accumulation unit. The transmission unit 9 can transmit the data signal while the accumulated direct current signal serves as a power source for the transmission unit 9. A Low-Pass Filter (LPF) unit 17 cuts off a high frequency beyond the range of human hearing.

Figure 12:
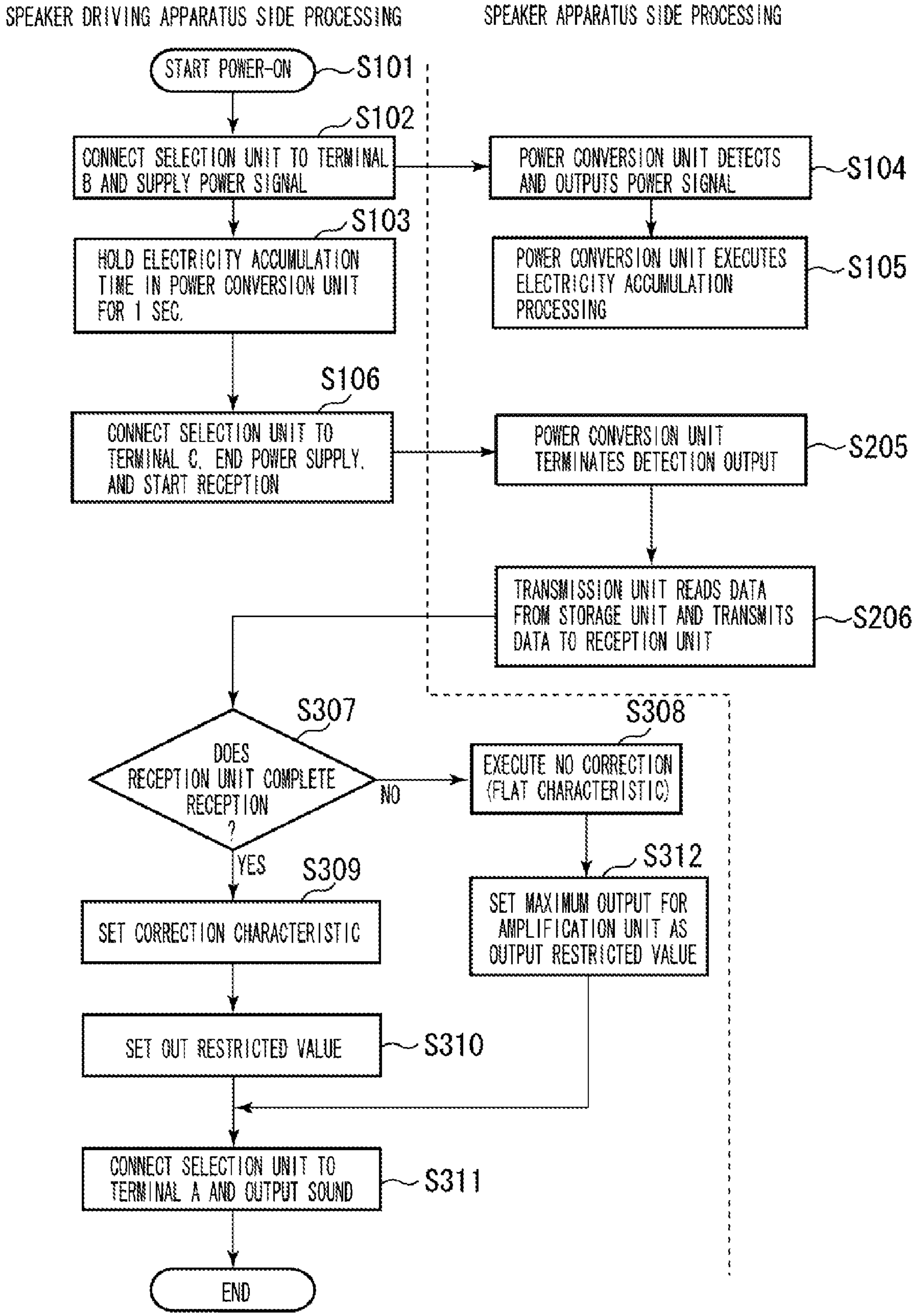
FIG. 12 is a flowchart illustrating processing of a sound player according to an exemplary embodiment of the present invention.

Operation of the sound player according to the present exemplary embodiment will be described in detail below using a processing flowchart illustrated in FIG. 12.

When the speaker driving apparatus 1 is turned on in step S101, in step S102, the control unit 3 performs control to connect the selection unit 4 to a terminal B. As a result, the sound player supplies a high-frequency power signal beyond the range of human hearing from the power supply unit 6 to the power conversion unit 8 of the speaker apparatus 2 via the cable 7.

In step S104, the power conversion unit 8 of the speaker apparatus 2 filters out and detects the input power signal. Then, the power conversion unit 8 supplies the filtered and detected power signal to the transmission unit 9 as a direct current signal, which indicates a supply of the power signal. In step S105, the power conversion unit 8 electrically accumulates the detected direct current signal. At this time, the sound player blocks the high-frequency power signal input to the speaker apparatus 2 with the LPF unit 17 so that the high-frequency power signal is not input to the speaker unit 16. If there appears no negative effect due to a high-pass block action effect even when the sound player inputs the high-frequency power signal to the speaker unit 16, the LPF unit 17 is not required. The high-pass block effect includes a mechanical high-pass block effect by a vibration system of the speaker unit 16 and an electrical high-pass block effect by inductance.

In step S103, the speaker driving apparatus 1 maintains a supply of the power signal, for example, for one second so that the power conversion unit 8 completes electricity accumulation. The power conversion unit 8 supplies the electrically accumulated electric power to the transmission unit 9 as a power supply.

In step S106, the control unit 3 controls the selection unit 4 to connect to a terminal C. The control unit 3 ends a supply of the power signal. The reception unit 12 starts reception of a data signal.

In step S205, the transmission unit 9 of the speaker apparatus 2 detects an end of a supply of the power signal from termination of a detection output from the power conversion unit 8.

When the speaker apparatus 2 detects an end of a supply of the power signal, in step S206, the transmission unit 9 uses an electricity accumulation output from the power conversion unit 8 as a power to read data stored in the storage unit 10. The read data includes maximum input electric power data of the speaker apparatus 2. Further, the transmission unit 9 outputs the read data to an input terminal 11 as a data signal including a high-frequency component beyond the range of human hearing. The transmission unit 9 transmits the data signal to the speaker driving apparatus 1.

The speaker driving apparatus 1 receives the data signal that the speaker apparatus 2 transmits through transmission processing in step S206, with the reception unit 12 via the selection unit 4 which selects the terminal C. The reception unit 12 outputs the received data signal to the control unit 3 as electroacoustic characteristic data and maximum input electric power data about the speaker apparatus 2. In step S307, the control unit 3 determines existence or non-existence, and correctness of the acquired data.

When the control unit 3 detects that the reception is completed (YES in step S307), in step S309, the control unit 3 sets a correction characteristic in the correction unit 13 so as to correct an audio signal by a reverse characteristic corresponding to the acquired electroacoustic characteristic data. In step S310, the control unit 3 sets a restriction value in the output restriction unit 27 which corresponds to and does not exceed the maximum input electric power data.

When the control unit 3 does not detect that the reception is completed successfully (NO in step S307), in step S308, the control unit 3 controls, for example, a correction characteristic in the correction unit 13 to be a flat characteristic. In step S312, the control unit 3 sets maximum output electric power in the amplification unit 15 as a restriction value in the output restriction unit 27.

The control unit 3 controls the correction unit 13 in correction processing in step S309 after the control unit 3 completes reception successfully, or in correction processing performed in step S308 when the control unit 3 does not complete reception successfully. Then, in step S311, the control unit 3 controls the selection unit 4 to select a terminal A. The correction unit 13 corrects the audio signal input to the audio input unit 14 of the speaker driving apparatus 1 so that a characteristic is suitable for an electroacoustic characteristic of the speaker apparatus 2. The amplification unit 15 amplifies the corrected audio signal. Further, the output restriction unit 27 performs output restriction to the audio signal so that the output does not exceed maximum input electric power. Then, the speaker unit 16 of the speaker apparatus 2 produces sound based on the corrected audio signal.

Second Exemplary Embodiment

Figure 2:
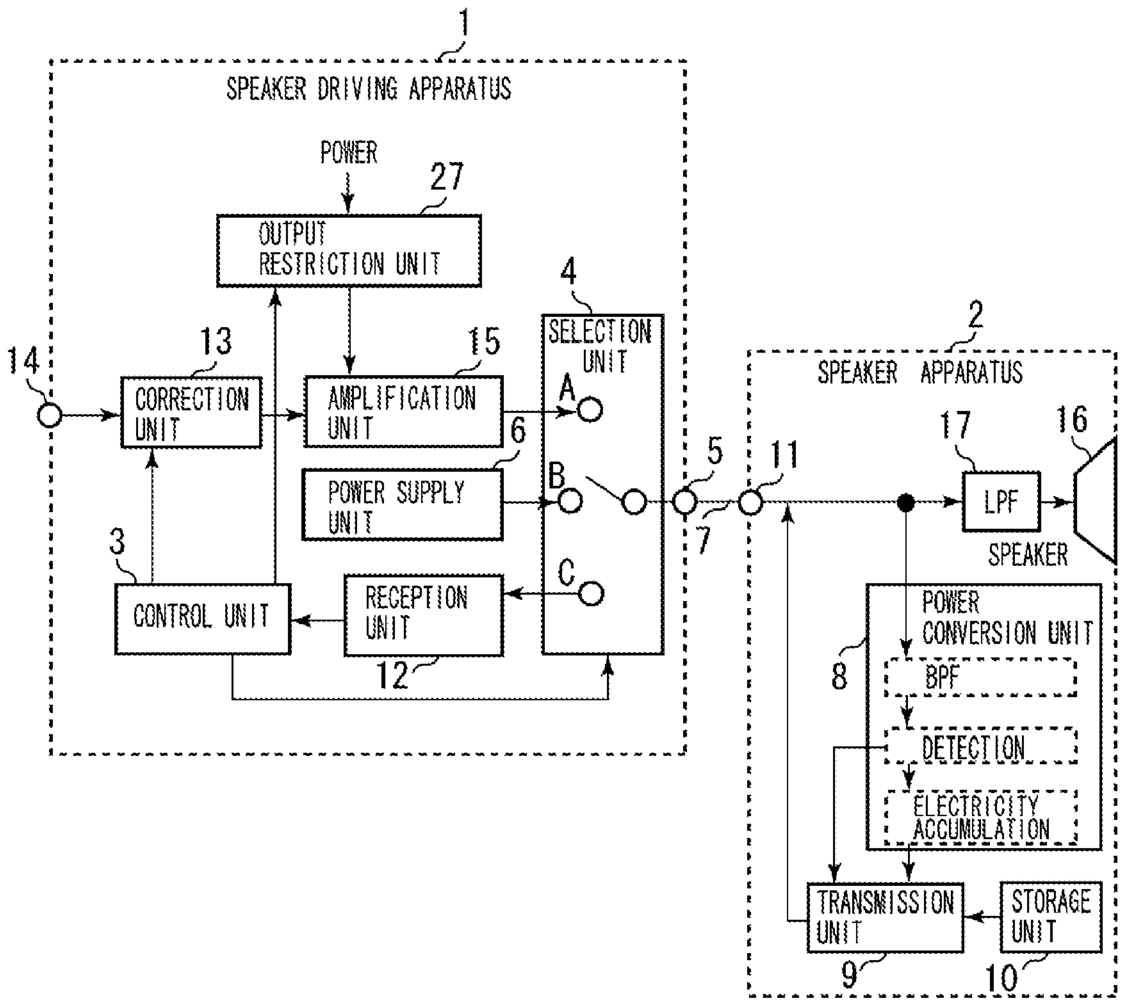
FIG. 2 is a block diagram illustrating a sound player according to a second exemplary embodiment of the present invention.

FIG. 2 is a block diagram illustrating a sound player according to a second exemplary embodiment of the present invention. In the second exemplary embodiment, a description about substantially the same configurations as those in the above-described first exemplary embodiment is not repeated, and the same reference numerals are provided to them. In the present exemplary embodiment, the output restriction unit 27 in the speaker driving apparatus 1 restricts a power supply to the amplification unit 15, which restricts output electric power in the amplification unit 15.

The output restriction unit 27 determines a voltage supplied to the amplification unit 15, or a restriction value of over current protection, according to a restriction value of the output electric power in the amplification unit 15 so that the output power of the amplification unit 15 does not exceed the maximum input electric power of the speaker apparatus 2. The maximum input electric power is instructed from the control unit 3. Thus, the sound player restricts electric power supplied to the speaker apparatus 2 so that the output does not exceed the maximum input electric power.

Third Exemplary Embodiment

Figure 3:
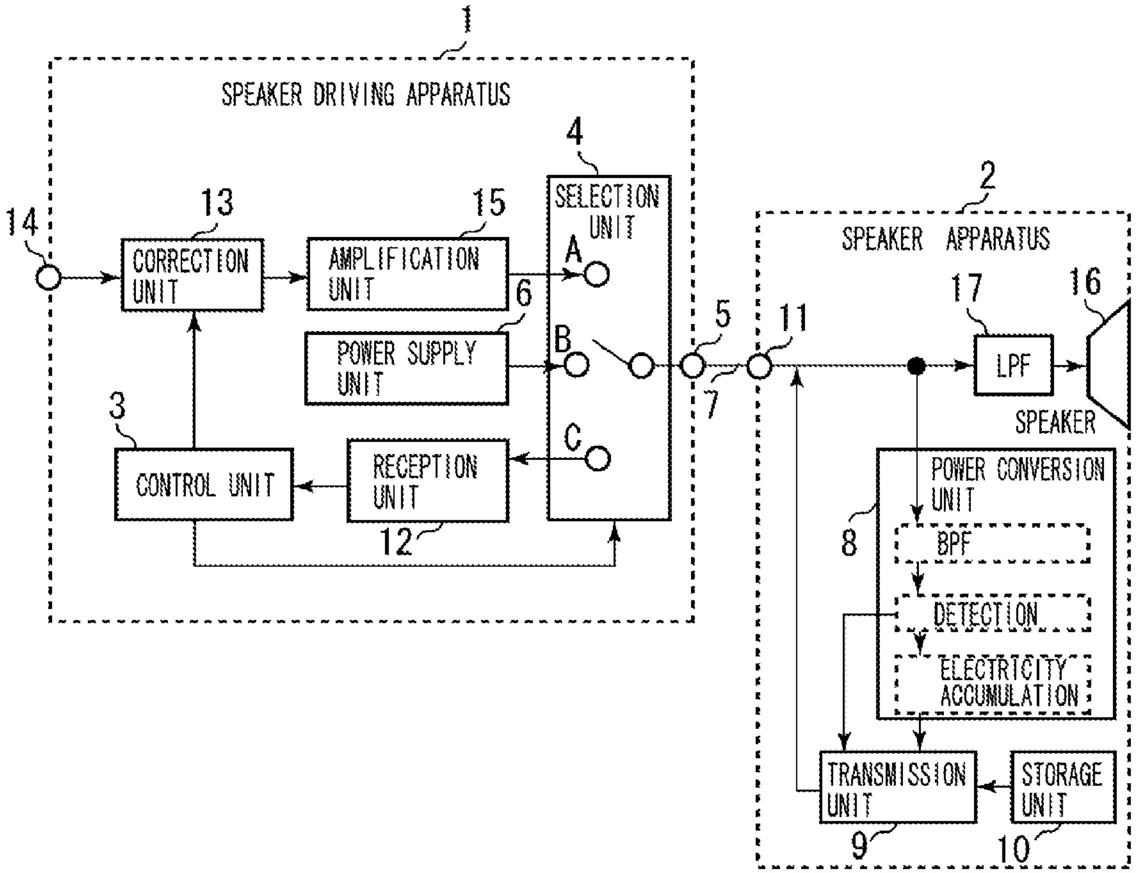
FIG. 3 is a block diagram illustrating a sound player according to a third exemplary embodiment of the present invention.

FIG. 3 is a block diagram illustrating a sound player in a third exemplary embodiment of the present invention. In the third exemplary embodiment, a description about substantially the same configurations as those in the above-described first exemplary embodiment is not repeated and the same reference numerals are provided to them.

In the present exemplary embodiment, instead of restricting output electric power in the amplification unit 15 by the output restriction unit 27 in FIG. 1, the sound player restricts the output electric power by the amplification unit 15 by controlling a sound volume in the correction unit 13.

The control unit 3 controls the correction unit 13 to correct an audio signal by a reverse characteristic corresponding to electroacoustic characteristic about the speaker apparatus 2. Simultaneously, the control unit 3 controls amplitude of the audio signal input to the amplification unit 15 so as to restrict a sound volume according to the maximum input electric power of the speaker apparatus 2. Thus, the sound player restricts an output signal in the amplification unit 15 so that the output does not exceed the maximum input electric power of the speaker apparatus 2.

Fourth Exemplary Embodiment

Figure 4:
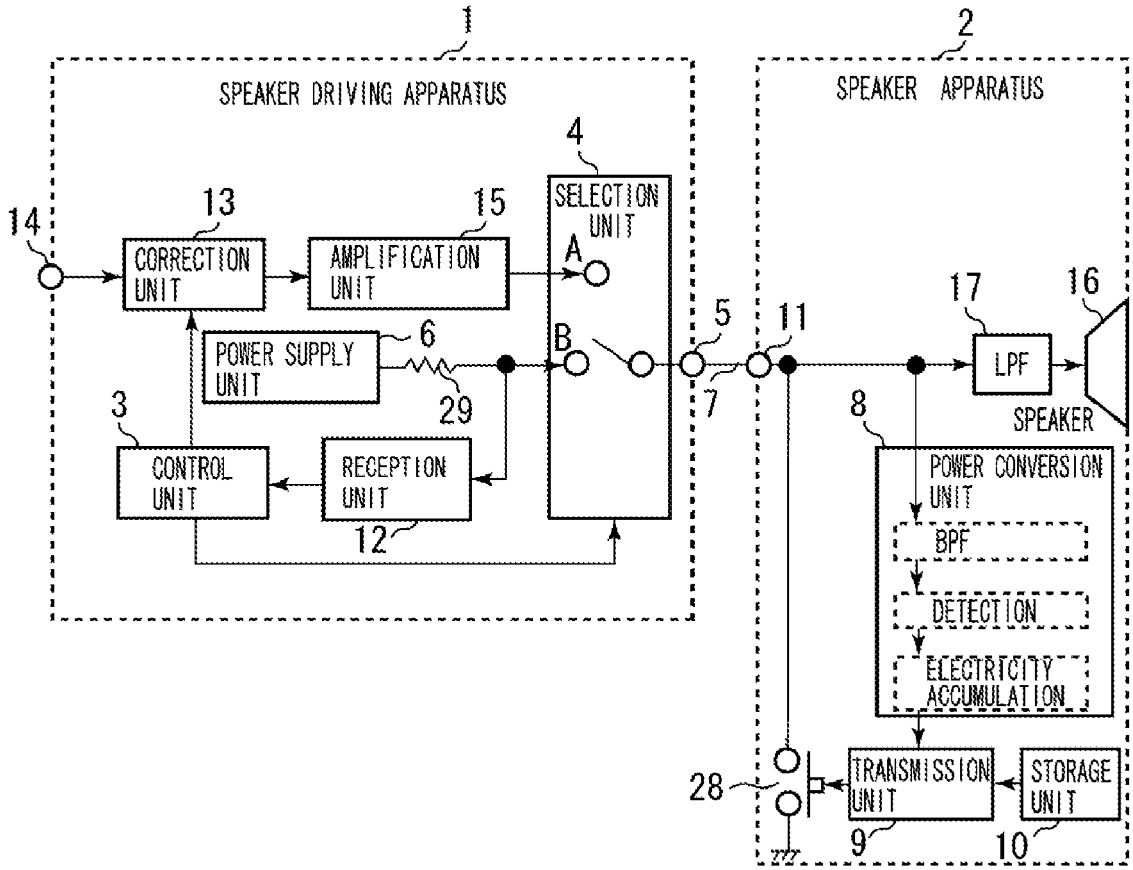
FIG. 4 is a block diagram illustrating a sound player according to a fourth exemplary embodiment of the present invention.

FIG. 4 is a block diagram illustrating a sound player according to a fourth exemplary embodiment of the present invention. In the fourth exemplary embodiment, a description about substantially the same configurations as those in the above-described first exemplary embodiment is not repeated and the same reference numerals are provided to them.

In the sound player according to the present exemplary embodiment, an impedance unit 29 is disposed between the power supply unit 6 and the selection unit 4 to add impedance to a power signal output. Further, the power signal output is connected to a data signal input in the reception unit 12. The transmission unit 9 switches the power signal in response to a data signal by operating a switching unit 28 disposed on the speaker apparatus 2.

The control unit 3 controls the selection unit 4 to select the terminal B for predetermined time after the speaker driving apparatus 1 is turned on. A power signal output from the power supply unit 6, to which impedance is added, is output to the output terminal 5 to supply the power signal to the speaker apparatus 2 via the cable 7.

The power conversion unit 8 electrically accumulates the power signal in the speaker apparatus 2 and supplies the power signal to the transmission unit 9 as a power source. When a sufficient amount of power for transmission is supplied to the transmission unit 9, the transmission unit 9 controls the switching unit 28 to perform ON/OFF operation according to data on the storage unit 10 so that a data signal in the storage unit 10 is transmitted to the speaker driving apparatus 1 as a digital signal. That is, the data signal is a pulse signal which converts a power signal based on electroacoustic characteristic and/or maximum input electric power. The reception unit 12 of the speaker driving apparatus 1 receives the data signal formed by the power signal subjected to the switching. The present exemplary embodiment omits power supply termination processing in step S204 which controls the selection unit 4 to select the terminal C as is described in the exemplary embodiments described above. Accordingly, the configuration according to the present embodiment is simplified.

Fifth Exemplary Embodiment

Figure 5:
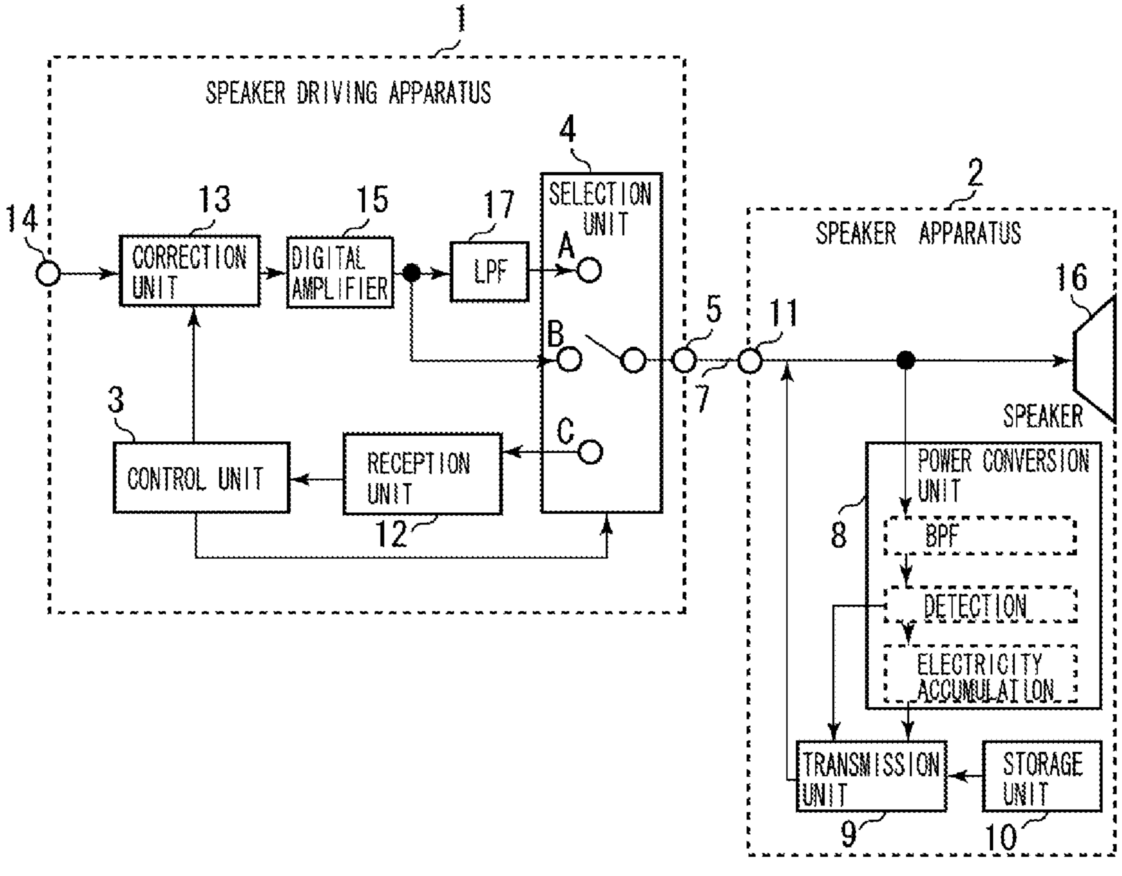
FIG. 5 is a block diagram illustrating a sound player according to a fifth exemplary embodiment of the present invention.

FIG. 5 is a block diagram illustrating a sound player according to a fifth exemplary embodiment of the present invention. In the fifth exemplary embodiment, a description about substantially the same configurations as those in the above-described first exemplary embodiment is not repeated and the same reference numerals are provided to them.

The amplification unit 15 is a digital amplifier. The sound player outputs its switching output signal to the terminal B in the selection unit 4. The sound player outputs an audio signal obtained by filtering out the switching output signal in the LPF unit 17, to the terminal A in the selection unit 4. The amplification unit 15 (i.e., the digital amplifier) is also capable of outputting a switching signal which is another audio signal generated by subjecting a high frequency wave beyond the range of human hearing to pulse modulation.

The control unit 3 controls the selection unit 4 to select the terminal B for a predetermined time after a power of the speaker driving apparatus 1 is turned on. A switching output signal is output from the amplification unit 15 to the output terminal 5 as a power signal of high frequency beyond the range of human hearing. Then, the power signal is supplied to the speaker apparatus 2 via the cable 7.

Then, an operation similar to the first exemplary embodiment is performed. In the fifth exemplary embodiment, the power supply unit 6 of the speaker driving apparatus 1 in FIG. 1 can be omitted and the configuration according to the present embodiment is simplified.

Sixth Exemplary Embodiment

Figure 6:
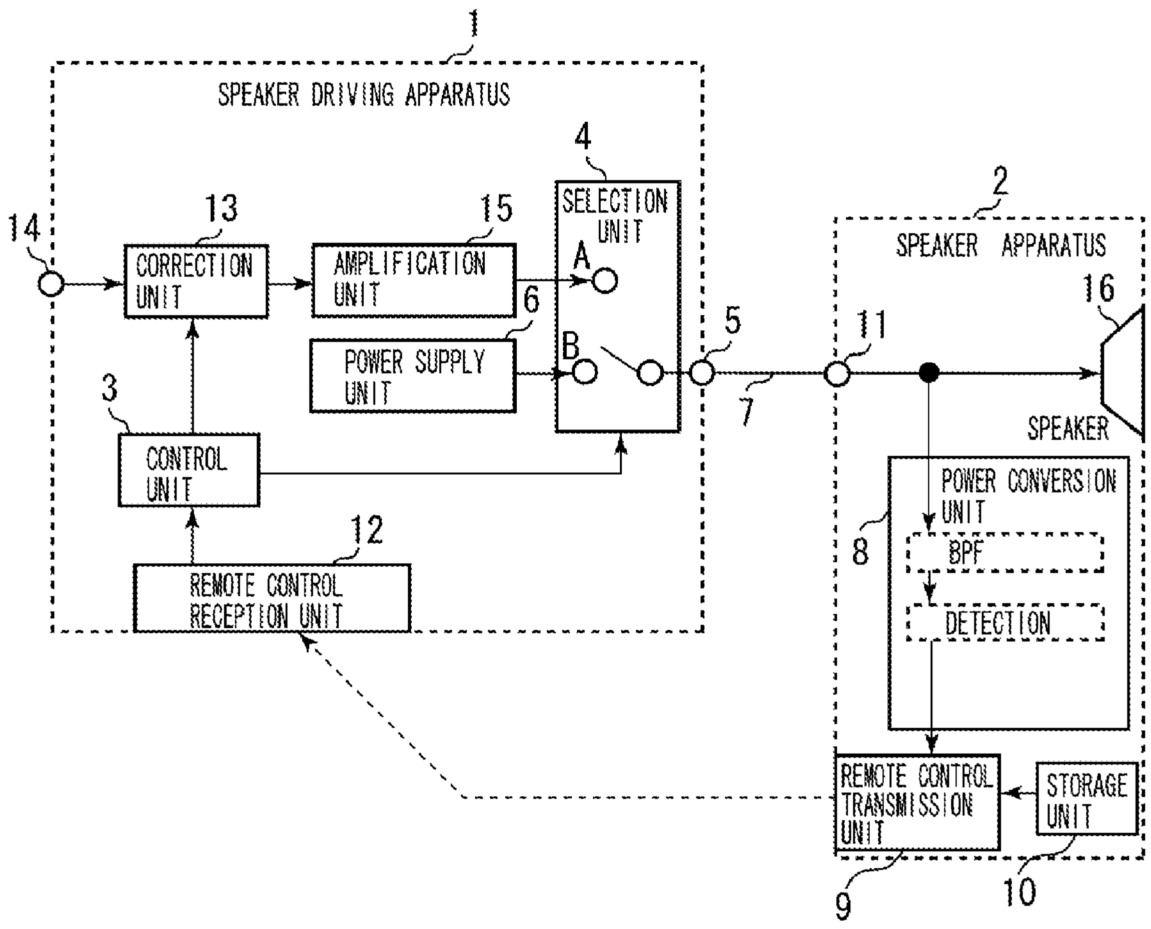
FIG. 6 is a block diagram illustrating a sound player according to a sixth exemplary embodiment of the present invention.

FIG. 6 is a block diagram illustrating a sound player according to a sixth exemplary embodiment of the present invention. In the sixth exemplary embodiment, a description about substantially the same configurations as those in the above-described first exemplary embodiment is not repeated and the same reference numerals are provided to them.

A transmission unit in the speaker apparatus 2 is a remote control transmission unit 9 having a similar configuration to an infrared remote control transmission apparatus which operates the speaker driving apparatus 1. A reception unit in the speaker driving apparatus 1 is an infrared remote control reception unit 12.

The control unit 3 controls the selection unit 4 to select the terminal B for a predetermined time after a power of the speaker driving apparatus 1 is turned on. A power signal of high frequency beyond the range of human hearing that the power supply unit 6 outputs, is output to the output terminal 5 and supplied to the speaker apparatus 2 via the cable 7.

The high-frequency power signal input to the speaker apparatus 2 is input to the power conversion unit 8. The sound player supplies a detected output to the transmission unit 9 as a power supply. When the sound player supplies the power to the transmission unit 9, the transmission unit 9 reads electroacoustic characteristic and maximum input electric power of the speaker apparatus 2 stored in the storage unit 10 to execute infrared transmission to the reception unit 12 as a data signal. At this time, the sound player does not transmit the data signal via the cable 7. Accordingly, an electricity accumulation operation in the power conversion unit 8 and time-division control of communication are not required.

The sound player inputs the data signal received by the reception unit 12 to the control unit 3 as electroacoustic characteristic data and maximum input electric power data about the speaker apparatus 2.

The control unit 3 corrects an input audio signal using a reverse characteristic corresponding to electroacoustic characteristic data. The control unit 3 controls the correction unit 13 to restrict output electric power output from the amplification unit 15 according to maximum input electric power. Then, the control unit 3 controls the selection unit 4 to select the terminal A.

The apparatus according to the sixth exemplary embodiment operates similar to the first exemplary embodiment as described below. The present exemplary embodiment can omit the terminal C in the selection unit 4 of the speaker driving apparatus 1 and an electricity accumulation unit in the power conversion unit 8 of the speaker apparatus 2 in FIG. 1. Thus, cost of the apparatus according to the can be lowered.

Seventh Exemplary Embodiment

Figure 7:
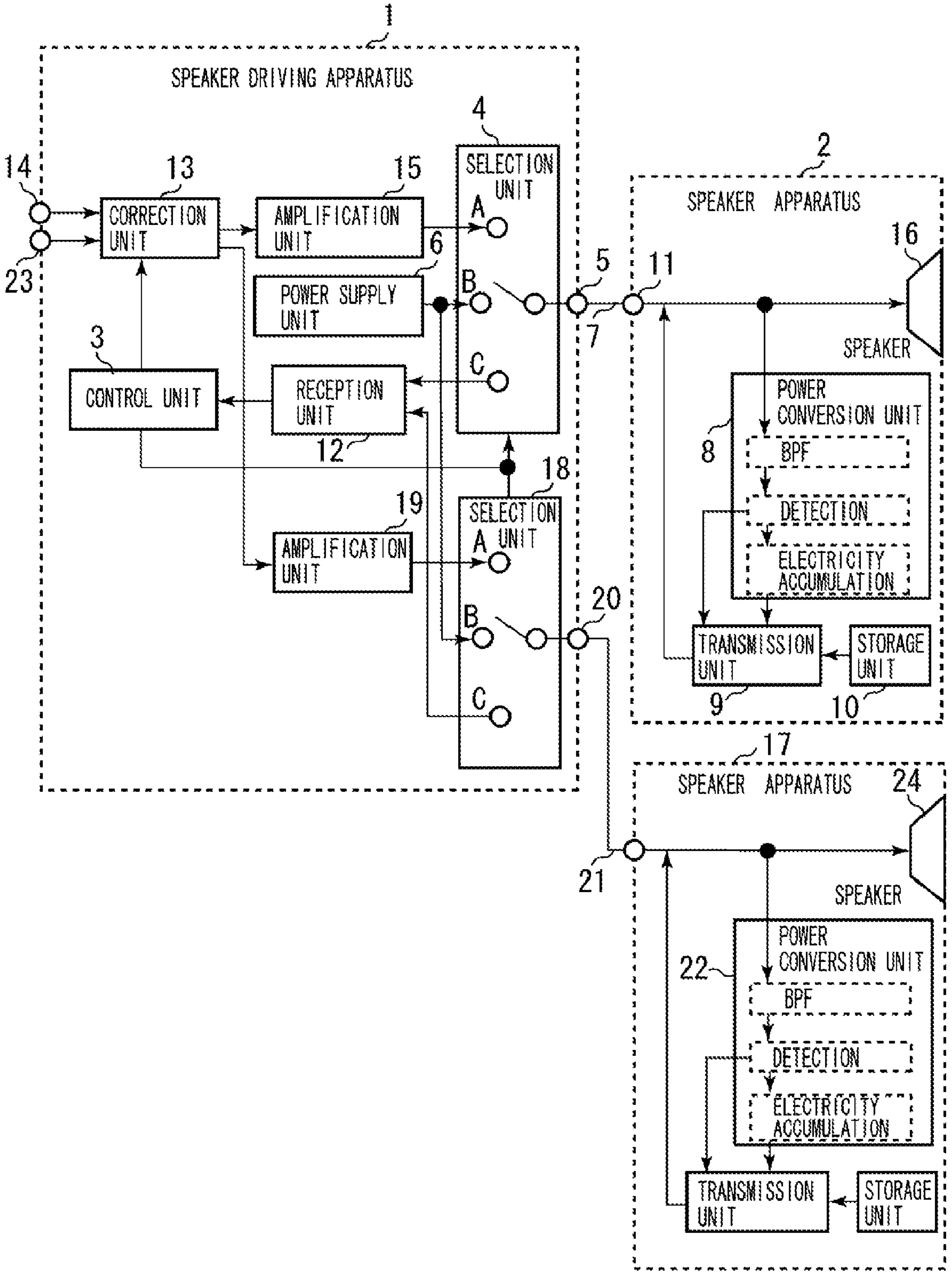
FIG. 7 is a block diagram illustrating a sound player according to a seventh exemplary embodiment of the present invention.

FIG. 7 is a block diagram illustrating a sound player according to a seventh exemplary embodiment of the present invention. In the seventh exemplary embodiment, a description about substantially the same configurations as those in the above-described first exemplary embodiment is not repeated and the same reference numerals are provided to them. The present exemplary embodiment includes not only a plurality of speaker apparatuses 2 and cables 7, but also a plurality of selection units 4, amplification units 15, and output terminals 5 in the speaker driving apparatus 1 in order to execute multichannel reproduction.

The control unit 3 controls the selection unit 4 (first selection unit) and a selection unit 18 (second selection unit) so that each selects a terminal B thereof for a predetermined time after a power of the speaker driving apparatus 1 is turned on. A power signal of high frequency beyond the range of human hearing is output from the power supply unit 6 to the output terminal 5 (first output terminal) and an output terminal 20 (second output terminal) respectively. The sound player supplies a power signal to the speaker apparatus 2 (first speaker apparatus) and a speaker apparatus 17 (second speaker apparatus) via the cable 7 (first cable) and a cable 21 (second cable).

When the power conversion units 8 and 22 complete electricity accumulation with the power signal input to the speaker apparatuses 2 and 27, the control unit 3 controls the selection units 4 and 18 so that each unit selects the terminal C. The sound player inputs a data signal corresponding to electroacoustic characteristic data and maximum input electric power data that the respective speaker apparatuses 2 and 27 transmit to the control unit 3 via the reception unit 12.

The control unit 3 controls an audio signal with a reverse characteristic corresponding to electroacoustic characteristic of the speaker apparatus 2 and 17. The control unit 3 also controls the correction unit 13 to restrict output electric power in the amplification units 15 and 19 according to the maximum input electric power. The sound player controls the selection units 4 and 18 so that each unit selects the terminal A.

As described above, the sound player corrects the audio signal that is input to the respective audio input units 14 and 23 of the speaker driving apparatus 1. The audio signal is changed to a characteristic suitable for an electroacoustic characteristic of the respective speaker apparatus 2 and 17, by the correction unit 13. Further, the output is restricted by sound volume correction so that the output does not exceed a maximum input electric power of the respective speaker apparatus 2 and 17. Then, the amplification units 15 and 19 amplify the input audio signal. Then, the speaker units 16 and 24 each produce sound based on the respective corrected audio signals supplied thereto.

Eighth Exemplary Embodiment

Figure 8:
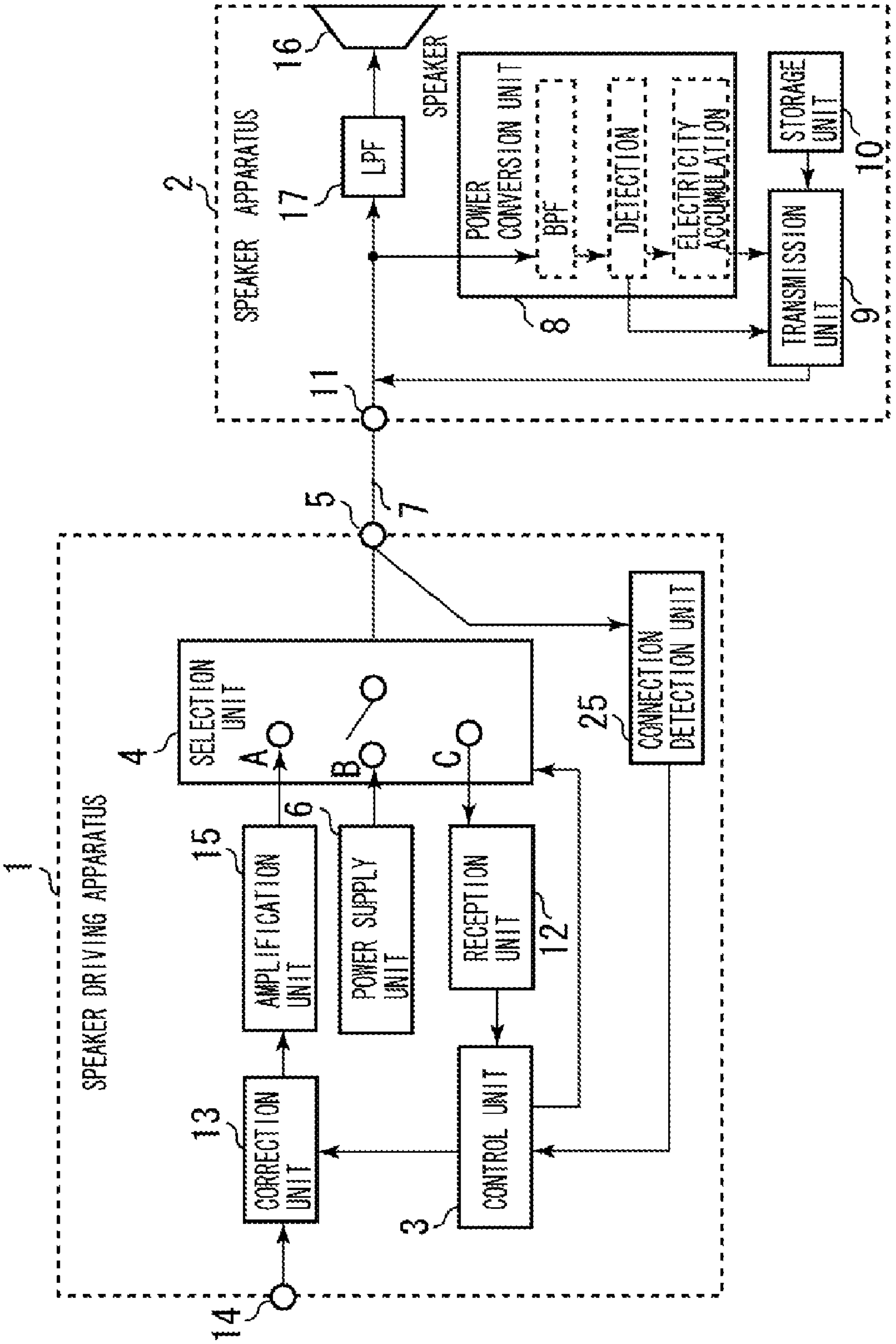
FIG. 8 is a block diagram illustrating a sound player according to an eighth exemplary embodiment of the present invention.

FIG. 8 is a block diagram illustrating a sound player according to an eighth exemplary embodiment of the present invention. In the eighth exemplary embodiment, a description about substantially the same configurations as those in the above-described first exemplary embodiment is not repeated and the same reference numerals are provided to them. In the present exemplary embodiment, a connection detection unit 25, which detects that the speaker apparatus 2 functioning as a load is connected, is connected to the output terminal 5.

The control unit 3 controls the selection unit 4 to select the terminal B for a predetermined time after a power of the speaker driving apparatus 1 is turned on or for a predetermined time after the connection detection unit 25 detects that the speaker apparatus 2 functioning as a load is connected to the output terminal 5 via the cable 7. A power signal of high frequency beyond the range of human hearing output from the power supply unit 6 is output to the output terminal 5 and supplied to the speaker apparatus 2 via the cable 7.

The apparatus according to the eighth exemplary embodiment operates similarly to the first exemplary embodiment in other respects.

According to the present exemplary embodiment, even if the speaker apparatus 2 is replaced when a power of the speaker driving apparatus 1 is still turned on, the sound player can correct an input audio signal so that a characteristic is suitable for an electroacoustic characteristic and maximum input electric power of a newly connected speaker apparatus.

Ninth Exemplary Embodiment

Figure 9:
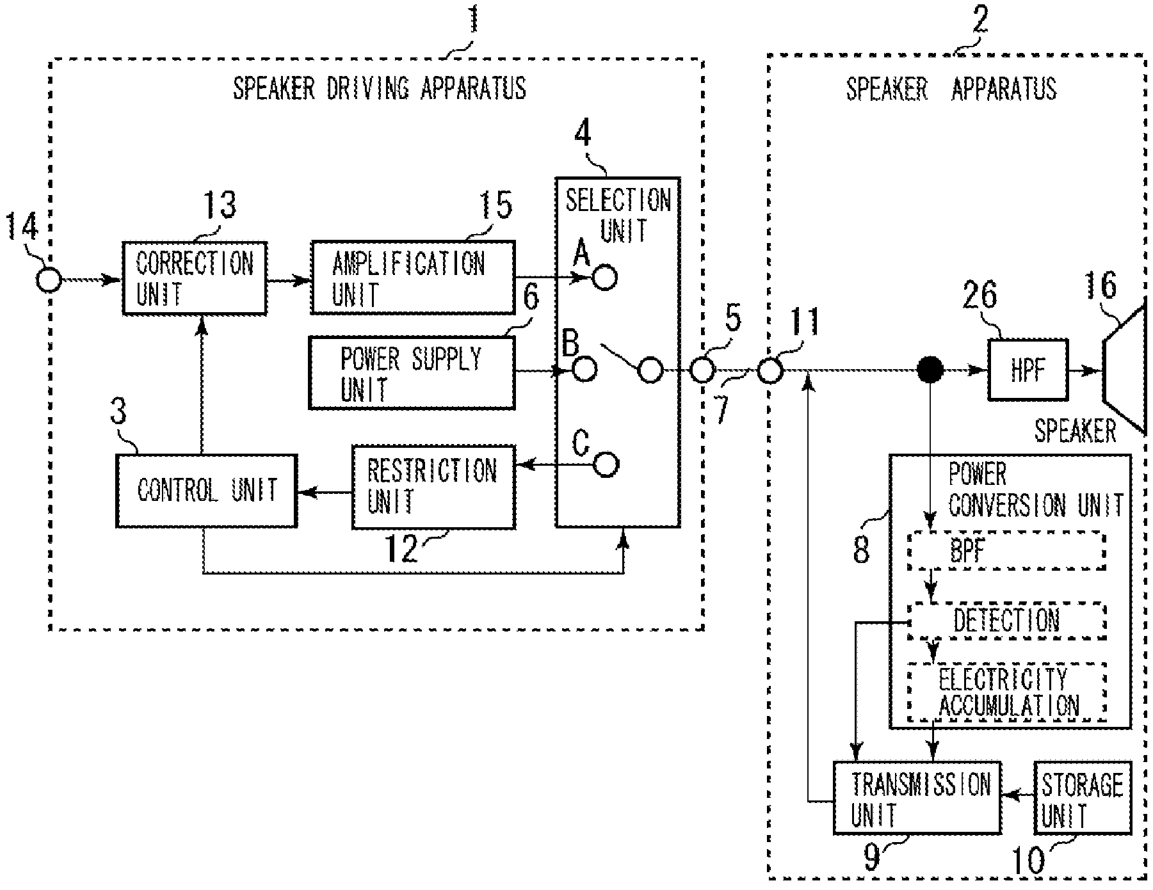
FIG. 9 is a block diagram illustrating a sound player according to a ninth exemplary embodiment of the present invention.
Figure 10:
FIG. 10 (Prior Art)
FIG. 10 is a block diagram illustrating a general sound player.
Figure 11:
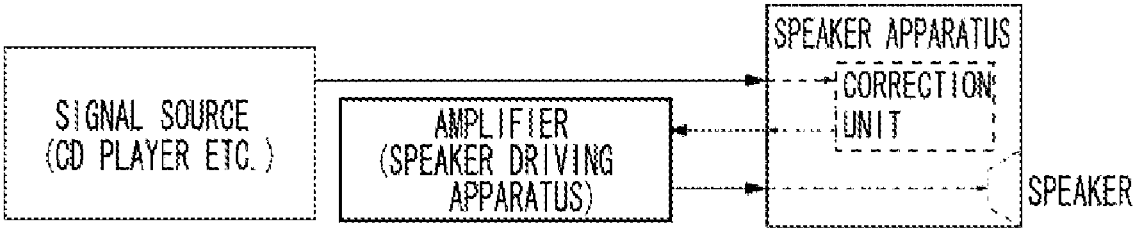
FIG. 11 (Prior Art)
FIG. 11 is a block diagram illustrating a conventional sound player.

FIG. 9 is a block diagram illustrating a sound player according to a ninth exemplary embodiment of the present invention. In the ninth exemplary embodiment, a description about substantially the same configurations as those in the above-described first exemplary embodiment is not repeated and the same reference numerals are provided to them. In the present exemplary embodiment, the power supply unit 6 outputs a power signal of low frequency outside the range of human hearing, or a direct current.

The control unit 3 controls the selection unit 4 to select the terminal B for a predetermined time after a power of the speaker driving apparatus 1 is turned on. The power signal of the low frequency outside the range of human hearing, or the direct current output from the power supply unit 6 is output to the output terminal 5 and supplied to the speaker apparatus 2 via the cable 7.

The low-frequency power signal input to the speaker apparatus 2, is not input to the speaker apparatus 16 because it is cut off by a high-pass filter unit (HPF) 26 but is input to the power conversion unit 8. An output detected in the power conversion unit 8 is input to the transmission unit 9 as a signal indicating a supply of the power signal. Simultaneously, an output, which is converted into a direct current voltage and electrically accumulated, is supplied to the transmission unit 9 as a power supply.

The apparatus according to the ninth exemplary embodiment operates in a similar manner to the first exemplary embodiment in other respects.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-036604 filed Feb. 16, 2007, which is hereby incorporated by reference herein in its entirety.

What is claimed is:

1. A speaker driving apparatus, adapted to be connected to a speaker apparatus, the speaker driving apparatus comprising:

an amplification unit for amplifying an input audio signal to generate an output audio signal for driving the speaker apparatus;

a power signal generation unit operable to generate a power signal for transmission to the speaker apparatus;

a transmission unit operable to transmit the output audio signal and the power signal to the speaker apparatus;

a reception unit for receiving, from the speaker apparatus, a data signal representing data relating to one or more characteristics of the speaker apparatus;

a signal modification unit operable to modify the input audio signal in dependence upon the received data signal; and a selection unit for selectively connecting the amplification unit, the power signal generation unit, and the reception unit to a connection terminal.

2. A speaker driving apparatus according to claim 1, wherein the data signal includes data relating to an electroacoustic characteristic of the speaker apparatus, and the signal modification unit includes a correction unit operable to correct an electroacoustic characteristic of the input audio signal in dependence upon the data relating to the electroacoustic characteristic of the speaker apparatus.

3. A speaker driving apparatus according to claim 1, wherein the data signal includes data relating to a maximum input power of the speaker apparatus, and the signal modification unit includes an output restriction unit for restricting an output power of the output audio signal in dependence upon the data relating to a maximum input power of the speaker apparatus.

4. A speaker driving apparatus according to claim 1, wherein the transmission unit transmits the power signal from the power signal generation unit to the speaker apparatus through the connection terminal before the reception unit receives the data signal from the speaker apparatus through the connection terminal, and transmits the output audio signal from the amplification unit through the connection terminal after the reception unit receives the data signal from the speaker apparatus through the connection terminal.

5. A speaker driving apparatus according to claim 1, wherein: the power signal is supplied to the speaker apparatus through an impedance unit; the data signal is a pulse signal derived from the power signal based on the data relating to one or more characteristics of the speaker apparatus; and the pulse signal is input to the reception unit without going through the impedance unit.

6. A speaker driving apparatus according to claim 1, wherein the amplification unit and the power signal generation unit are both part of a digital amplifier.

7. A speaker driving apparatus according to claim 1, wherein the speaker driving apparatus is adapted to be connected to a plurality of speaker apparatuses, wherein the speaker driving apparatus includes a plurality of amplification units, where each amplification unit is operable to receive an input audio signal and to generate an output audio signal for driving a corresponding one of the plurality of speaker apparatuses.

8. A speaker driving apparatus according to claim 7, wherein the power signal generation unit is operable to generate a power signal for transmission to each of the plurality of speaker apparatuses.

9. A speaker driving apparatus according to claim 7, wherein the reception unit is operable to receive, from each of the plurality of speaker apparatuses, a data signal relating to one or more characteristics of a particular speaker apparatus and the signal modification unit is operable, for each of the plurality of speaker apparatuses, to modify at least one audio signal of the corresponding amplification unit in dependence upon the data signal received by the reception unit from the particular speaker apparatus.

10. A speaker driving apparatus according to claim 1, further comprising: a connection detection unit operable to detect when a speaker apparatus is newly connected to the speaker driving apparatus; and a control unit operable, in response to detection by the connection detection unit, to cause the speaker driving apparatus to carry out an initialization operation in which a power signal is transmitted to a newly-connected speaker apparatus, and a data signal is received from the newly-connected speaker apparatus.

11. A speaker apparatus, adapted to be connected to a speaker driving apparatus, the speaker apparatus comprising:

a power signal receiving unit for receiving a power signal from the speaker driving apparatus;

a power conversion unit for converting the received power signal into DC power, wherein the power conversion unit includes a filter unit operable to restrict a frequency band of the power signal, a detection unit operable to convert the power signal, after passage thereof through the filter unit, into a DC signal, and an accumulation unit operable to accumulate electrical energy using the DC signal produced by the detection unit; and a data signal transmission unit operable to transmit to the speaker driving apparatus data relating to one or more characteristics of the speaker apparatus using the DC power from the power conversion unit as a power supply.

12. A speaker apparatus according to claim 11, wherein the data includes data relating to an electroacoustic characteristic of the speaker apparatus.

13. A speaker apparatus according to claim 11, wherein the data includes data relating to a maximum input power of the speaker apparatus.

14. A method of operating a speaker driving apparatus, the method comprising:

amplifying an input audio signal to generate an output audio signal for driving a speaker apparatus connected to the speaker driving apparatus;

generating a power signal for transmission to the speaker apparatus;

transmitting the output audio signal and the power signal to the speaker apparatus;

receiving, from the speaker apparatus, a data signal representing data relating to one or more characteristics of the speaker apparatus;

modifying the input audio signal in dependence upon the received data signal; and selectively connecting the amplification unit, the power signal generation unit, and the reception unit to a connection terminal.

15. A method of operating a speaker apparatus, the method comprising:

receiving a power signal from a speaker driving apparatus connected to the speaker apparatus;

converting the received power signal into DC power, wherein a filter unit restricts a frequency band of the power signal, a detection unit converts the power signal, after passage thereof through the filter unit, into a DC signal, and an accumulation unit accumulates electrical energy using the DC signal produced by the detection unit; and transmitting, to the speaker driving apparatus, data relating to one or more characteristics of the speaker apparatus using the DC power from the power conversion unit as a power supply.

16. A speaker driving apparatus according to claim 1, wherein the selection unit selectively connects at least two amplification units, the power signal generation unit, and the reception unit to a connection terminal.

* * * * *